(12) United States Patent
Yoo et al.

(10) Patent No.: US 11,488,845 B2
(45) Date of Patent: Nov. 1, 2022

(54) SUBSTRATE PROCESSING APPARATUS

(71) Applicant: EUGENE TECHNOLOGY CO., LTD., Yongin-Si (KR)

(72) Inventors: Cha Young Yoo, Suwon-Si (KR); Sung Tae Je, Yongin-Si (KR); Kyu Jin Choi, Yongin-Si (KR); Ja Dae Ku, Suwon-Si (KR); Jun Kim, Yongin-Si (KR); Bong Ju Jung, Hwaseong-Si (KR); Kyung Seok Park, Hwaseong-Si (KR); Yong Ki Kim, Osan-Si (KR); Jae Woo Kim, Bucheon-Si (KR)

(73) Assignee: EUGENE TECHNOLOGY CO., LTD.

( * ) Notice: Subject to any disclaimer, the term of this patent is extended or adjusted under 35 U.S.C. 154(b) by 117 days.

(21) Appl. No.: 15/767,995

(22) PCT Filed: Sep. 5, 2016

(86) PCT No.: PCT/KR2016/009925
§ 371 (c)(1),
(2) Date: Apr. 12, 2018

(87) PCT Pub. No.: WO2017/073902
PCT Pub. Date: May 4, 2017

(65) Prior Publication Data
US 2018/0298493 A1 Oct. 18, 2018

(30) Foreign Application Priority Data

Oct. 27, 2015 (KR) .................. 10-2015-0149573

(51) Int. Cl.
*H01L 21/67* (2006.01)
*C23C 16/44* (2006.01)
(Continued)

(52) U.S. Cl.
CPC .... *H01L 21/67069* (2013.01); *C23C 16/4412* (2013.01); *C23C 16/455* (2013.01);
(Continued)

(58) Field of Classification Search
CPC .............. C23C 16/455; C23C 16/4583; C23C 16/45504; C23C 16/4412;
(Continued)

(56) References Cited

U.S. PATENT DOCUMENTS 5,534,751 A * 7/1996 Lenz ................. H01J 37/32623
315/111.71
5,549,205 A * 8/1996 Doche ............... H01L 21/67393
206/710

(Continued)

FOREIGN PATENT DOCUMENTS

CN 104934348 A 9/2015
JP 08008234 A 1/1996
(Continued)

OTHER PUBLICATIONS

Merriam-Webster dictionary definition: "laminate" (Accessed Dec. 11, 2019).*
(Continued)

*Primary Examiner* — Gordon Baldwin
*Assistant Examiner* — Kurt Sweely
(74) *Attorney, Agent, or Firm* — Renaissance IP Law Group LLP

(57) ABSTRACT

In accordance with an exemplary embodiment, a substrate processing apparatus includes: a tube assembly having an inner space in which substrates are processed and assembled by laminating a plurality of laminates, each of which includes an injection part and an exhaust hole; a substrate holder configured to support the plurality of substrates in a multistage manner in the inner space; a supply line con-
(Continued)

nected to one injection part of the plurality of laminates to supply a process gas; and an exhaust line connected to one of a plurality of exhaust holes to exhaust the process gas, and the substrate processing apparatus that has a simple structure and induces a laminar flow of the process gas to uniformly supply the process gas to a top surface of the substrate.

16 Claims, 4 Drawing Sheets

(51) Int. Cl.
    *C23C 16/455*     (2006.01)
    *C23C 16/458*     (2006.01)
    *H01L 21/677*     (2006.01)
    *H01L 21/673*     (2006.01)

(52) U.S. Cl.
    CPC .... *C23C 16/4558* (2013.01); *C23C 16/45591* (2013.01); *C23C 16/4583* (2013.01); *C23C 16/4585* (2013.01); *C23C 16/45504* (2013.01); *C23C 16/45517* (2013.01); *H01L 21/67309* (2013.01); *H01L 21/67757* (2013.01)

(58) Field of Classification Search
    CPC ........ C23C 16/45563; C23C 16/45517; C23C 16/45559; C23C 16/52; C23C 16/45578; C23C 16/4558; C23C 16/45591; C23C 16/45508; C23C 16/45568; C23C 16/45587; C23C 16/4585; H01L 21/67757; H01L 21/67309; H01L 21/6719; H01L 21/6732; H01L 21/67346; H01L 21/67376; H01L 21/67383; H01L 21/67389; H01L 21/67393; H01L 21/6875; H01L 21/67017; H01L 21/67098; H01L 21/67103; H01L 21/67109; H01L 21/67115; H01L 21/67303; H01L 21/67069; C30B 25/12; C30B 25/14; C30B 25/16; C30B 25/165
See application file for complete search history.

(56) References Cited

U.S. PATENT DOCUMENTS

| | | | | |
|---|---|---|---|---|
| 6,013,155 | A * | 1/2000 | McMillin | C23C 16/455 118/723 I |
| 6,402,849 | B2 * | 6/2002 | Kwag | C23C 16/4412 118/715 |
| 6,444,262 | B1 * | 9/2002 | Kitamura | C23C 16/4584 427/248.1 |
| 7,850,780 | B2 * | 12/2010 | Levy | C23C 16/45551 118/715 |
| 10,840,118 | B2 * | 11/2020 | Yoo | C23C 16/45578 |
| 2007/0084408 | A1 * | 4/2007 | Yudovsky | C23C 16/45578 118/725 |
| 2012/0325145 | A1 * | 12/2012 | Sato | C23C 16/45546 118/666 |
| 2015/0197851 | A1 * | 7/2015 | Yoon | C23C 16/4584 118/723 I |
| 2015/0292088 | A1 * | 10/2015 | Canizares | C23C 16/45563 438/478 |

FOREIGN PATENT DOCUMENTS

| | | |
|---|---|---|
| JP | H09330884 A | 12/1997 |
| JP | 2004162114 A | 6/2004 |
| JP | 2008166321 A | 7/2008 |
| JP | 2009135551 A | 6/2009 |
| JP | 2009283641 A | 12/2009 |
| JP | 2010059490 A | 3/2010 |
| JP | 2011512031 A | 4/2011 |
| KR | 20100083611 A | 7/2010 |
| KR | 101463592 B1 | 11/2014 |
| KR | 101524905 B1 | 6/2015 |
| TW | 201324661 A | 6/2013 |

OTHER PUBLICATIONS

Written Opinion for PCT/KR2016/009925 dated Nov. 30, 2016.
International Search Report for PCT/KR2016/009925 dated Nov. 30, 2016.

* cited by examiner

110 : 111, 112, 113, 114, 115, 116
112 : 112a, 112b

114 : 114a, 114b, 114c

SUBSTRATE PROCESSING APPARATUS

BACKGROUND

The present disclosure relates to a substrate processing apparatus, and more particularly, to a substrate processing apparatus that has a simple structure and induces a laminar flow of a process gas to uniformly supply the process gas to a top surface of a substrate.

In general, a substrate processing apparatus is classified into a single wafer type substrate processing apparatus, which is capable of performing a substrate processing process on one substrate, and a batch type substrate processing apparatus, which is capable of performing a substrate processing process on a plurality of substrates at the same time. Such a single wafer type substrate processing apparatus has a simple structure, but has low productivity. Thus, the batch type substrate processing apparatus capable of being mass-producing substrates is being widely used.

The batch type substrate processing apparatus includes a processing chamber in which substrates horizontally laminated in a multistage manner are accommodated and processed, a process gas supply nozzle for supplying a process gas into the processing chamber, and an exhaust line through which the gas in the processing chamber is exhausted. The substrate processing process using the batch type substrate processing apparatus is performed as follows. First, a plurality of substrates are loaded into the processing chamber. Then, while a gas within the processing chamber is exhausted through the exhaust line, a process gas is supplied into the processing chamber through the process gas supply nozzle. The process gas injected from the process gas supply nozzle is introduced into the exhaust line through an exhaust hole while passing between the substrates to form a thin film on each of the substrates.

Here, in order to form a thin film having a uniform thickness on the top surface of the substrate, it is important to divide a space in which each substrate is processed to induce a laminar flow of the process gas. However, in the case of the substrate processing apparatus according to the related art, it may be difficult to divide the space in which the substrates are processed, and thus, the laminar flow of the process gas may not be effectively induced. Thus, a uniform amount of process gas may not be supplied to the top surface of the substrate to deteriorate quality of the thin film.

In addition, since an amount of process gas supplied to a circumference and a bottom surface of the substrate in the process gas is large, an amount of process gas supplied to the top surface of the substrate to actually participate in the substrate processing process may be small. Thus, the process gas may be wasted, and efficiency of the substrate processing process may be deteriorated.

Technical Problem

The present disclosure also provides a substrate processing apparatus that is capable of inducing a laminar flow of a process gas.

The present disclosure also provides a substrate processing apparatus having a simple structure.

The present disclosure also provides a substrate processing apparatus that is capable of improving efficiency of a substrate processing process.

Technical Solution

In accordance with an exemplary embodiment, a substrate processing apparatus includes: a tube assembly having an inner space in which substrates are processed and assembled by laminating a plurality of laminates, each of which includes an injection part and an exhaust hole; a substrate holder configured to support the plurality of substrates in a multistage manner in the inner space; a supply line connected to one injection part of the plurality of laminates to supply a process gas; and an exhaust line connected to one of a plurality of exhaust holes to exhaust the process gas.

Each of the laminates may include: a plate having a surface area; a hollow part provided in a central portion of the plate so that the substrate holder is movable; and protrusion parts, each of which protrudes from at least one surface of a first surface and a second surface, which face each other, on a circumference of the plate.

The gas supply unit may be disposed on one side of the plate, and the protrusion parts may include: a pair of first protrusion members spaced apart from each other on both sides of the plate in a direction crossing an injection direction of the process gas to inject a flow of the process gas from one side to the other side of the plate; and a pair of second protrusion members connected to the first protrusion members and spaced apart from each other in the injection direction of the process gas.

The injection part may include a body having a spreading space into which the process gas is supplied, and the process gas may be injected from one side of the body, which faces the exhaust hole.

The body may be separably inserted into the protrusion part and seated on the plate.

At least a portion of the body may be opened, and the injection part may further include a guide member disposed on the body to adjust a flow of the process gas.

The guide member may be provided in plurality to be spaced apart from each other in a direction crossing the injection direction of the process gas.

A supply hole may be defined in each of the plate and the body, and the supply holes of the plurality of plates and the body may be aligned in a line to provide a path through which the process gas moves.

The body may be integrated with the protrusion part, and the injection part may further include a main injection hole defined in one side of the body and an auxiliary injection hole defined in one side of the body and spaced apart from the injection hole.

A plurality of isolation plates, which divide a processing space in which each of the substrates is processed, may be provided in the substrate holder, and the injection part may inject the process gas between the isolation plates.

Advantageous Effects

In accordance with the exemplary embodiment, a plurality of laminates may be laminated to form a path through which the process gas flows in one direction. Therefore, a space in which a process gas is dispersed may be reduced to concentratedly supply the process gas to a substrate. Thus, an amount of process gas supplied to the substrate to actually participate in the substrate processing process may increase to reduce a waste of the process gas and improve an efficiency of the substrate processing process.

Also, an injection part for injecting the process and an exhaust hole through which the process gas is exhausted may be provided in a laminate of the tube assembly, and thus, a separate injection nozzle and exhaust duct may not be provided. Therefore, a structure of equipment may be simplified to easily realize a maintenance and repair.

Also, the laminar flow of the process gas supplied to the substrate may be induced. Therefore, the process gas may be supplied in parallel to a top surface of the substrate and thus be uniformly supplied to an entire top surface of the substrate. Thus, a thin film having the uniform thickness may be formed on the top surface of the substrate to improve the quality of the thin film.

DETAILED DESCRIPTION

Figure 1:
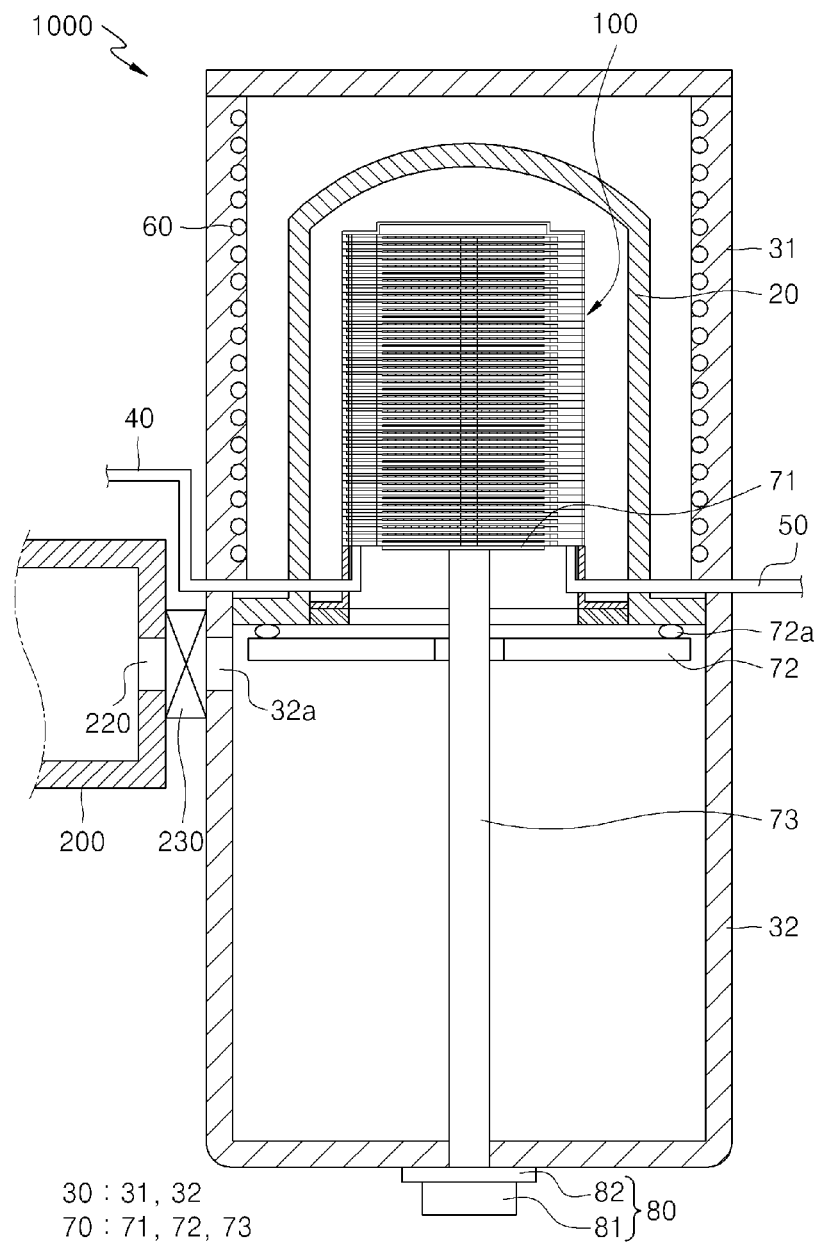
FIG. 1 is a view illustrating a structure of a substrate processing apparatus in accordance with an exemplary embodiment.

Hereinafter, embodiments will be described in detail with reference to the accompanying drawings. The present invention may, however, be embodied in different forms and should not be construed as limited to the embodiments set forth herein. Rather, these embodiments are provided so that the present invention will be thorough and complete, and will fully convey the scope of the present invention to those skilled in the art. In the figures, the dimensions of layers and regions are exaggerated for clarity of illustration. Like reference numerals refer to like elements throughout.

Figure 2:
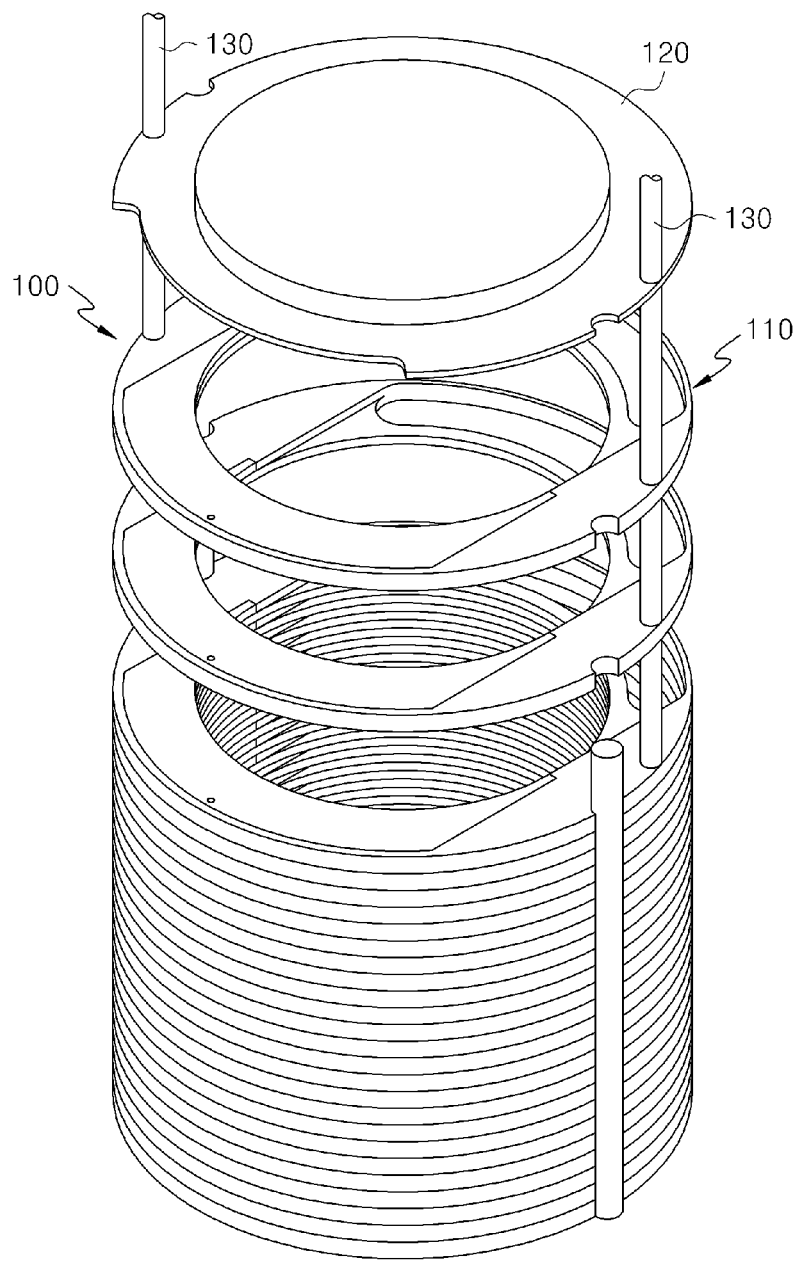
FIG. 2 is a perspective view of a tube assembly in accordance with an exemplary embodiment.
Figure 3:
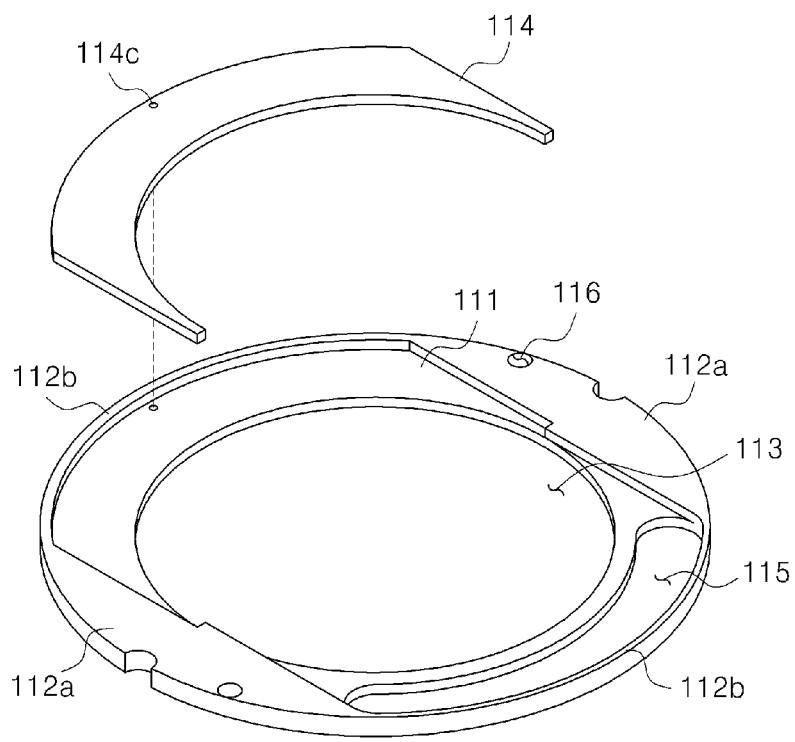
FIG. 3 is a perspective view of a laminate in accordance with an exemplary embodiment.
Figure 4:
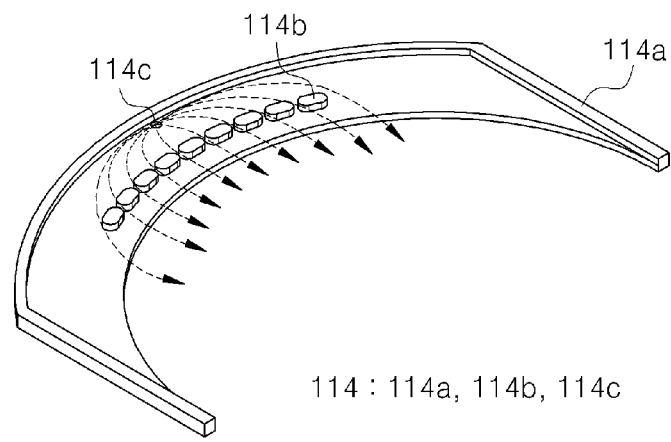
FIG. 4 is a view of an injection part in accordance with an exemplary embodiment.
Figure 5:
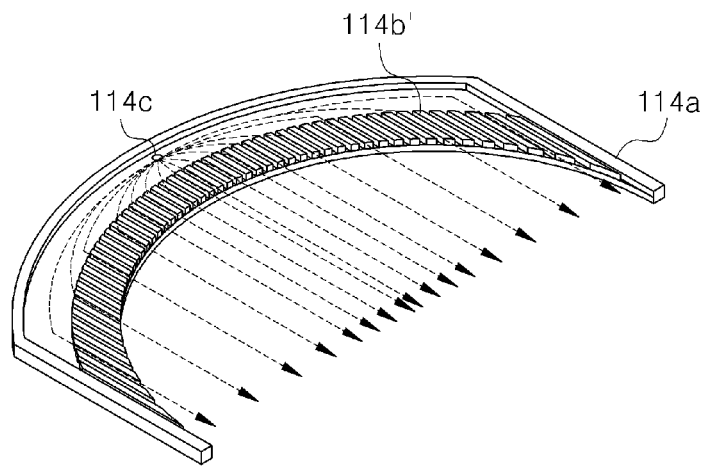
FIG. 5 is a view of an injection part in accordance with another exemplary embodiment.
Figure 6:
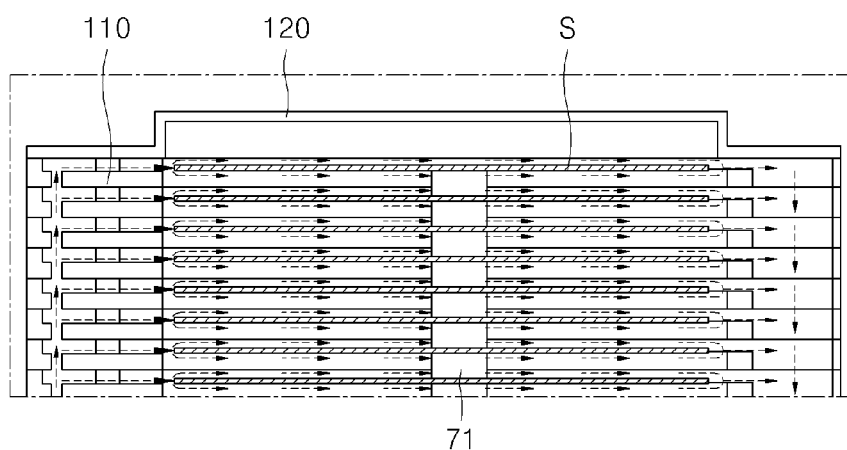
FIG. 6 is a view illustrating a flow of a process gas within the tube assembly in accordance with an exemplary embodiment.
Figure 7:
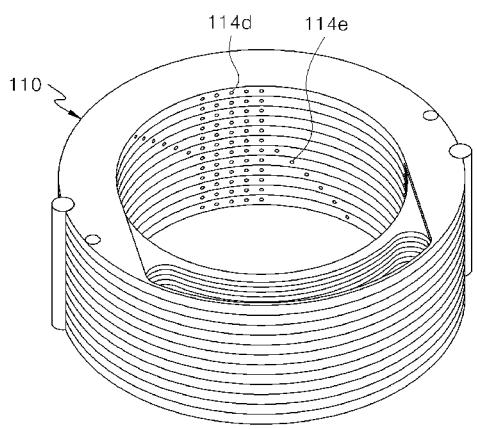
FIG. 7 is a perspective view of a tube assembly in accordance with another exemplary embodiment.

FIG. 1 is a view illustrating a structure of a substrate processing apparatus in accordance with an exemplary embodiment, FIG. 2 is a perspective view of a tube assembly in accordance with an exemplary embodiment, FIG. 3 is a perspective view of a laminate in accordance with an exemplary embodiment, FIG. 4 is a view of an injection part in accordance with an exemplary embodiment, FIG. 5 is a view of an injection part in accordance with another exemplary embodiment, FIG. 6 is a view illustrating a flow of a process gas within the tube assembly in accordance with an exemplary embodiment, and FIG. 7 is a perspective view of a tube assembly in accordance with another exemplary embodiment.

Referring to FIGS. 1 and 3, a substrate processing apparatus 1000 in accordance with an exemplary embodiment includes a tube assembly 100 having an inner space in which substrates S are processed and assembled by laminating a plurality of laminates 110, each of which is provided with an injection part 114 and an exhaust hole 115, a substrate holder 71 supporting the plurality of substrates S in a multistage manner in the inner space of the tube assembly 100, a supply unit 40 connected to one injection part 114 of the plurality of laminates 110 to supply a process gas, and an exhaust line 50 connected to one of the plurality of exhaust holes 115 to exhaust the process gas. Also, the substrate processing apparatus 1000 may further include a chamber unit 30, an outer tube 20, a support unit 71 provided with the substrate holder 70, a driving unit 80, and a heating unit 60.

The chamber unit 30 may have a rectangular box or cylindrical shape. The chamber unit 30 may include an upper chamber 31 and a lower chamber 32. A lower portion of the upper chamber 31 and an upper portion of the lower chamber 32 are connected to each other.

An entrance communicating with the transfer chamber 200 for transferring the substrates S is provided in a side surface of the lower chamber 32. Thus, the substrate S may be loaded from the transfer chamber 200 to the lower chamber 32 through the entrance. An inflow hole 220 is defined in one side of the transfer chamber 200 to correspond to the entrance of the lower chamber 32. A gate valve 230 is disposed between the inflow hole 220 and the entrance. Thus, the inner space of the transfer chamber 200 and the inner space of the lower chamber 200 may be isolated by the gate valve 230. Also, the inflow hole 220 and the entrance are opened or closed by the gate valve 230.

Also, the substrates S loaded into the lower chamber 32 may move upward to be processed within the upper chamber 31. Thus, the inside of the lower chamber 32 may provide a loading space in which the substrates S are loaded, and the inside of the upper chamber 31 may provide a process space for the substrates S. However, an exemplary embodiment is not limited to the structure and shape of the chamber unit 130. For example, the chamber unit 130 may have various structures and shapes.

The outer tube 20 may have a cylindrical shape and be disposed above the lower chamber having an opened upper portion or within the upper chamber 31. The outer tube 20 has an inner space in which the tube assembly 100 is accommodated and has an opened lower portion. Here, an inner wall of the outer tube 20 and an outer wall of the tube assembly 100 may be spaced apart from each other to provide a space between the outer tube 20 and the tube assembly 100. However, an exemplary embodiment is not limited to the structure and shape of the outer tube 20. For example, the outer tube 20 may have various structures and shapes.

The support unit 70 may include the substrate holder 71, a blocking plate 72 for sealing the inside of the tube assembly 100, a shaft 73, and a plurality of isolation plates respectively disposed between the substrates S in a loading direction of the substrates S to divide the inner space into processing spaces in which the plurality of substrates S are processed.

The substrate holder 71 is configured to load the plurality of substrates S in a vertical direction. The substrate holder 71 may include a plurality of support bars extending in the vertical direction and an upper plate connected to the support bars to support the support bars. A support tip for easily supporting the substrates S may protrude from each of the support bars to a center of the substrate S.

The upper plate may have a circular plate shape and have a diameter greater than that of the substrate S. Three support bars may be provided to be spaced apart from each other along a circumference of the upper plate and then be connected to an outer lower portion of the upper plate. The support tip may be provided in plurality to be spaced apart from each other in a line in the extension direction of the support bar. Thus, the substrate holder 71 may vertically provide a plurality of layers, on which the substrates S are loaded, and one substrate S may be loaded on one layer (or the processing space). However, an exemplary embodiment is not limited to the structure and shape of the substrate holder 71. For example, the substrate holder 71 may have various structures and shapes.

The blocking plate 72 may have a circular plate shape and a diameter greater than that of the substrate holder 71. The blocking plate 72 is connected to a lower portion of the substrate holder 71. Thus, when the substrate holder 71 moves from the lower chamber 32 into the tube assembly 100, the blocking plate 72 may also move upward together with the substrate holder 71 to close the opened lower portion of the tube assembly 100. Also, a sealing member 72a having an O-ring shape may be disposed between the blocking plate 72 and the outer tube 20 or between the blocking plate 72 and the tube assembly 100. Thus, when the processing process is performed on the substrate S, the inside of the tube assembly 100 may be sealed from the lower chamber 32 and prevent the process gas within the tube assembly 100 from being introduced into the lower chamber 32 or foreign substances within the lower chamber 32 from being introduced into the tube assembly 100. However, an exemplary embodiment is not limited to the structure and shape of the blocking plate 72. For example, the blocking plate 72 may have various structures and shapes.

The shaft 73 may have a bar shape that extends in the vertical direction. The shaft 73 may have an upper end connected to the blocking plate 72 and a lower end connected to the driving unit 80. Thus, the substrate holder 71 may rotate by the driving unit 80 with respect to a vertical central axis of the shaft 73 and vertically move by the driving unit 80 along the shaft 73.

The isolation plate may have a circular plate shape and be provided in plurality to be respectively disposed on lower portions of the support tips. That is, the isolation plate may be fitted into the support bars and disposed to be spaced apart from each other between the support tips. Thus, the isolation plate may distinguish the processing spaces, in which the substrates S are processed, from each other. Thus, the processing space may be individually defined in each layers of the substrate holder 71.

The driving unit 80 may include a vertical driver 81 vertically moving the support unit 70 and a rotating driver 82 rotating the support unit 70.

The vertical driver 81 may be a cylinder and connected to the lower portion of the support unit 70, i.e., the shaft 73 to vertically move the support unit 70. Thus, the support unit 70 on which the substrate S is loaded may be vertically moved between the tube assembly 100 and the lower chamber 32. That is, when the vertical driver moves the support unit 70 downward, the substrates S may be seated on the support unit 70 through the entrance of the lower chamber 32. When all the substrate S are seated on the support unit 70, the vertical driver may move the support unit 70 into the tube assembly 100 disposed thereabove so that the processing space is performed on the substrates S.

The rotating driver 82 may be a motor and connected to the lower portion of the support unit 70, i.e., the shaft 73 to rotate the support unit 70. When the support unit 70 is rotated by using the rotating driver 82, the process gas moved to passing through the substrate S loaded on the support unit 70 may be mixed and thus uniformly distributed above the substrate S. Thus, a thin film deposited on the substrate S may be improved in quality. However, an exemplary embodiment is not limited to the above-described method for vertically moving or rotating the support unit 70 by using the driving unit 80. For example, the driving unit 80 may move or rotate the support unit 70 through various methods.

The heating unit 60 may be a heater disposed outside the outer tube 20. For example, the heating unit 60 may be inserted into and installed in the inner wall of the upper chamber 31 to surround a side surface and an upper portion of the outer tube 20. Thus, when the heating unit 60 generates heat energy, the heat energy may pass through the outer tube 20 to increase an inner temperature of the tube assembly 100. Thus, the heat unit 60 may be controlled so that the inner temperature of the tube assembly 100 is adjusted to a temperature at which the substrate S is easily processed. However, an exemplary embodiment is not limited to the installation position of the heating unit 60. For example, the heating unit 60 may be disposed at various positions.

The supply line 40 serves to supply the process gas to the tube assembly 100. The supply line 40 may have a pipe shape and have one end connected to the tube assembly 100 and the other end connected to a process gas supply source (not shown). For example, the supply line 40 may be connected to the lowermost laminate 110 of the plurality of laminates 110 to supply the process to the lowermost laminate 110, thereby supplying the process gas to the uppermost laminate 110. That is, when the injection parts 114 provided in the plurality of laminates 110 communicate with each other to supply the process gas to the lowermost injection part, the process gas may be supplied to all the injection parts.

Thus, the process gas supplied from the process gas supply source may be supplied into the tube assembly 100 through the supply line 40. Thus, the equipment may be simplified in structure without providing a separate injection nozzle. Also, the process gas supply source may be provided in plurality to separately store a source gas, an etch gas, a dopant gas, and a carrier gas. The gases may be mixed at various ratios and supplied to the supply line 40 to control a thickness of the thin film on the substrate S.

Also, one or plurality of control valves may be provided in the supply line 40 to control an amount of process gas to be supplied to the tube assembly 100. However, an exemplary embodiment is not limited to the structure and shape of the process gas supply line 40. For example, the process gas supply line 142 may have various structures and shapes.

The exhaust line 50 may have a pipe shape and have one end connected to the tube assembly 100 and the other end connected to a suction unit (not shown). For example, the exhaust line 50 may be connected to the lowermost laminate 110 of the plurality of laminates 110 to provide suction force to the lowermost laminate 110, thereby supplying the process gas to the uppermost laminate 110. That is, when the exhaust holes 115 defined in the plurality of laminates 110 communicate with each other to provide the suction force to the lowermost exhaust hole, the suction force may be provided to all the exhaust holes.

Thus, the gas within the tube assembly 100 may be suctioned into the exhaust hole 115 by the suction force provided by the suction unit and then discharged to the outside of the tube assembly 100 along the exhaust line 50. Thus, since a separate duct for exhausting a gas is not provided, the equipment may be simplified and easily maintained and repaired. However, an exemplary embodiment is not limited to the structure and shape of the exhaust line 50. For example, the exhaust line 50 may have various structures and shapes.

The tube assembly 100 has an inner space in which the substrate S is accommodated and has an opened lower portion. Thus, the inside of the tube 100 may communicate with the inside of the lower chamber 32, and thus, the substrate S may move between the tube assembly 100 and the lower chamber 32. Thus, when the substrate holder 71 is disposed in the lower chamber 32, the substrate S may be loaded, and the substrate holder 71 may move into the tube assembly 100 to perform the processing process on the substrate S.

Here, the substrate processing apparatus 1000 in accordance with an exemplary embodiment may be an epitaxial apparatus for forming an epitaxial layer on the substrate S. When a selective epitaxial growth (SEG) process is performed on the substrate S, the process gas may be supplied into all the processing spaces. The process gas may include at least one of the source gas, the etch gas, the dopant gas, and the carrier gas, and the gases may be mixed at various ratios and supplied to control the thickness of the thin film on the substrate S.

Since the gases have molecular weights different from each other, a flow of the process gas may vary according to the ration of the gases. Thus, in the selective epitaxial growth, a flow of the process gas may be an important factor for determining the thickness and composition of the thin film on the substrate S.

For example, the process gas supplied from the injection part 114 of the laminate 110 may be suctioned into the exhaust hole 115 via the substrate S to generate a laminar flow. That is, the process gas supplied to a side surface of the substrate S may come into contact with the side surface of the substrate S to move along the top and bottom surfaces of the substrate S. Thus, since the process gas flows in parallel to the substrate S, the process gas may be uniformly supplied to the top surface of the substrate S. Thus, the tube assembly 100 in accordance with an exemplary embodiment may be provided to induce the laminar flow so that the process gas is uniformly supplied to the top surface of the substrate S.

Referring to FIGS. 2 and 3, a plurality of laminates 110 may be vertically laminated to form the tube assembly 100. Also, the tube assembly 100 may include a cover 120 covering an upper portion of the uppermost body of the plurality of laminates 110 and a fixing bar 130 fixing the plurality of tube assemblies 100. The tube assembly 100 may be seated on and fixed to an upper side of the lower chamber 32 and disposed within the upper chamber 31. In detail, the tube assembly 100 may be disposed within the outer tube 120 disposed within the upper chamber 31.

The laminate 110 may include a plate 111 having a surface area, a hollow part 113 defined in a central portion of the plate 111 to allow the substrate holder 71 to be movable, a protrusion part 112 protruding from at least one surface of a first surface and a second surface, which face each other, of the plate 111 along a circumference of the plate 111, an injection part 114 injecting the process, and an exhaust hole 115 exhausting the process gas.

The plate 111 may have a circular plate shape having a predetermined surface area. The plurality of plates 111 are vertically spaced apart from each other. Thus, a space is defined between the plates 111. However, an exemplary embodiment is not limited to the shape of the plate 111. For example, the plate 111 may have various shapes.

The hollow part 113 may be provided in the central portion of the plate 111 and have a circular shape corresponding to a planar shape of the substrate holder 71. Also, the hollow part 113 may have a diameter greater than that of the substrate holder 71. Thus, the substrate holder 71 may vertically move within the tube assembly 100 through the hollow part 113. However, an exemplary embodiment is not limited to the shape of the hollow part 113. For example, the hollow part 113 may have various shapes.

Here, the plate 111 may be disposed on the same line as the isolation plate of the support unit 70 in a horizontal direction. That is, in the state in which the substrate holder 71 is disposed within the tube assembly 100, the plate 111 and the isolation plate may be disposed on the same line. Thus, the processing space in which each of the substrates S is processed and the moving path through which the process gas moves may be effectively distinguished by the plate 111 and the isolation plate. Thus, when the process gas is injected into the processing space for each substrate S, the process gas may not be dispersed, but be concentratedly supplied into the process space.

The protrusion part 112 may protrude from at least one surface of the first surface and the second surface, which face each other, on the circumference of the plate 111. For example, the protrusion part 112 may protrude upward or downward from the top and bottom surfaces of the plate 111. Thus, since the protrusion part 112 surrounds the plate 111, when the protrusion parts 112 are laminated, the process space in which the substrate S is processed may be sealed. That is, the process gas supplied into the protrusion part 112 may be suppressed or prevented from being dispersed to the outside by the protrude part 112.

That is, when the laminates 110 are vertically laminated, the protrusions 112 may be laminated to come into contact with each other. Thus, the plates 111 may be spaced apart from each other and supported by the protrusion part 112, and the protrusion part 112 may support the plates 111.

Also, the protrusion parts 112 may include a pair of first protrusion members 112a spaced apart from each other on both sides of the plate 111 in a direction crossing the injection direction of the process gas to induce a flow of the process gas from one side to the other side of the plate 111 and a pair of second protrusion members 112b connected to the first protrusion members 112a and disposed to be spaced apart from each other on both sides of the plate 111 in the injection direction of the process gas.

The first protrusion member 112a may be provided in a pair, and the pair of first protrusion members 112a may be disposed to be spaced apart from each other on both the sides of the plate 111. For example, when the process gas moves backward from the front of the plate 111, the first protrusion members 112a may be disposed on left and right sides of the plate 111. The first protrusion members 112a may be disposed in the direction crossing the injection direction of the process gas to form a wall on each of left and right sides of the plate 111 in a direction parallel to the injection direction of the process gas.

Thus, the first protrusion members 112a may induce the flow of the process gas so that the process gas moves backward from the front of the plate 111, i.e., in one direction without the process gas is dispersed in left and right directions. Thus, the first protrusion members 112a may induce the flow of the process gas to be parallel to the top surface of the substrate S disposed on a central portion of the plate 11 so that the process gas is concentrated onto the top surface of the substrate S. That is, the laminar flow of the process gas may be induced. Thus, an amount of process gas participating in the substrate processing process may increase to improve efficiency of the substrate processing process.

The second protrusion members 112b may be disposed on the front and rear of the plate 111 and connected to the first protrusion member 112b. That is, the second protrusion members 112b may be connected to the first protrusion members 112a to surround the entire circumference of the plate 111. Thus, a process into which the process gas is supplied may be defined inside the protrusion part 112 to prevent the process gas from being discharged to the outside.

However, an exemplary embodiment is not limited to the structure and shape of the protrusion part 112. For example, the protrusion part 112 may have various structures and shapes.

As described above, the protrusion parts 112 may support the plate 111 and allows the plate 111 to be spaced therefrom and also control the flow of the process gas supplied to the substrate S. That is, since the wall defined by the first protrusion member 112a is parallel to the injection direction of the process gas, the process gas may move along the moving path defined by the first protrusion members 112a without being dispersed in left and right directions. Thus, an amount of process gas passing over the substrate S disposed on the moving path defined by the first protrusion members 112a may increase, and thus, an amount of process gas actually participating in the substrate processing process may increase.

Also, the process, which is defined by the protrusion parts 112 and the plate 111, may induce the flow of the process gas to be parallel to the top surface of the substrate S. Thus, when the process gas moves along the moving path defined by the protrusion part 112 and the plate 111, the laminar flow may be smoothly induced to supply a uniform amount of process gas onto the entire top surface of the substrate S. Thus, the thin film having the uniform thickness may be formed.

A space into which the process gas is supplied may be defined in the protrusion part 112, particularly, the first protrusion member 112a, a plurality of injection holes (not shown) may be defined in the protrusion part 112, particularly, an inner wall of the first protrusion member 112a. Thus, the process gas may be injected into the first protrusion members 112a disposed on the left and right sides of the plate 111 in addition to the injection part 114 provided at the front of the plate 111.

That is, the process gas injected to the substrate S may move along the circumference of the substrate S and the bottom surface of the substrate S in addition to the top surface of the substrate S. Thus, only a portion of the process gas supplied to the top surface of the substrate S may actually participate in the substrate processing process, and the other portion of the process gas may not actually participate in the substrate processing process.

Thus, the process gas may be injected to the front of the substrate S through the injection part 114 and also injected from both sides of the substrate S through the injection holes defined in the protrusion part 112. Thus, the process gas injected from the injection holes may induce the flow of the process gas injected from the injection part 114 to the central portion of the substrate S, and thus, an amount of process gas participating in the substrate processing process may increase.

The injection part 114 may be provided in number corresponding to that of plates 111 to inject the process gas between the isolation plates. That is, the process gas may be injected into each of the processing spaces defined by the plate 111 and the isolation plate. The injection part 114 may include a body 114a having a spreading space into which the process gas is supplied and may inject the process gas to one side of the body 114a facing the exhaust hole 115. For example, the one side of the body 114a may be opened. Also, the injection part 114 may include a guide member 114b provided in the body 114a to adjust a flow of the process gas.

The body 114a may have a shape corresponding to that of the plate 111 between the protrusion part 112 and the hollow part 113 so that the body 114a is inserted into the front of the plate 111. For example, the body 114a may be separably inserted into the protrusion part 112 and seated on the plate 111. Since a stepped portion is provided between the protrusion part 112 and the plate 111, when the body 111a is seated on the top surface of the plate 111, three surfaces of the side surfaces of the body 114a may come into contact with the protrusion part 112 and be inserted into and fixed to the protrusion part 112. Thus, the body 114a may be separated from or inserted into the plate 111 and the protrusion part 112, and thus, the body 114a may be easily replaced or repaired.

Also, the spreading space into which the process gas is supplied may be defined in the body 114a, and a portion of the body 114a, which faces the exhaust hole 114 defined in the rear of the plate 111, may be opened. Thus, the process gas supplied into the spreading space may be injected through the opened portion of the body 114a to move to the exhaust hole 115.

Here, one or plurality of supply holes 114c through which the process gas moves may be defined in the body 114a and the plate 111. Thus, when the plurality of laminates 110 are vertically laminated, the body 114a and the plate 111 may be aligned with each other in a line, and thus, the supply holes 114c provided in the body 114a and the plate 111 may be vertically disposed in a line to provide one or plurality of moving paths for the process gas. Thus, a portion of the process gas supplied into the spreading space may be injected to the substrate S, and the other portion may be introduced into the upper supply holes and supplied into the upper spreading space of the body.

Also, the supply line 40 may communicate with or be connected to a supply hole defined in the lowermost plate of the plurality of laminates 110. Thus, when the process gas is supplied to the supply line 40, the process gas may be supplied from the lowermost injection part to the uppermost injection part 114 through the supply hole 114c, and the injection parts 114 may inject the process gas into the processing spaces for the substrate S. However, an exemplary embodiment is not limited to the shape of the body 114a. For example, the body 114a may have various shapes.

Also, the process gas may use by mixing at least one of the source gas, the etch gas, the dopant gas, and the carrier gas, and the mixture may be mixed one more time within the spreading space of the body 114a. That is, since the process gas is spread from the narrow supply hole 114c to the wide spreading space within the body 114a, the process gas may be mixed. Thus, the effectively mixed process gas may be supplied to each of the substrates S to improve processing efficiency of the substrate S.

A portion at which at least a portion of the body 114a of the plurality of injection parts 114 is opened may have a different width. That is, the portion of the body 114a into which the process gas is injected may have a width that varies in accordance with a height thereof. Also, a width of the plate 111 between a hollow part 112 of the plurality of laminates 110 and the exhaust hole 115 may be different in the vertical direction. That is, a thickness of the opened portion of the injection part 114 or the plate 111 of the plurality of laminates 110 may be adjusted so that at least a portion of the portion through which the process gas is suctioned and the portion through which the process gas is exhausted has a different size in the vertical direction.

For example, an amount of process gas injected from the injection part that is close to the process gas supply line 40 and the injection hole that is far away from the process gas supply line 40 among the plurality of injection parts 114 may vary in accordance with a pressure difference. Thus, the portion of the upper injection part of the plurality of injection parts 114, into which the process gas is injected, may have a large width, and the portion of the lower injection part, into which the process gas is injected, may have a low width.

That is, a large amount of process gas may be smoothly supplied to the upper side because the portion into which the process gas is injected increases in width, and a small amount of process gas may be supplied to the lower side because the portion into which the process gas is injected decreases in width. Thus, a uniform amount of process gas may be supplied to the upper substrate S and the lower substrate S within the tube assembly 100. However, an exemplary embodiment is not limited to a method for adjusting the width of the opened portion of the body 114a. For example, the body 114a may be adjusted in width through various methods.

Also, the upper plate 111a of the plurality of plates 111 may increase in width, and the lower plate 111 may decrease in width to adjust a size of the portion through which the process gas introduced into the exhaust 115 passes. Thus, the upper portion through which the process gas passes may increase in size so that the process gas smoothly moves to be injected into the exhaust hole 115, and the lower portion through which the process gas passes may decrease in size so that an amount of process gas introduced into the exhaust hole 115 decreases. Thus, an amount of process gas increases at the upper side at which a relatively small amount of process gas is supplied due to the pressure difference, and an amount of process gas decreases at the lower side at which a relatively large amount of process gas is supplied. As a result, a uniform amount of process gas may be supplied into the whole region of the tube assembly 100. However, an exemplary embodiment is not limited to a method for adjusting a thickness of each of the plates 111. For example, the thickness of the plate 111 may be adjusted through various methods.

The guide member 114b may be provided in the spreading space or the opened portion of the body 114a. The guide member 114b may spread the process gas within the body 114a to adjust a flow of the process so that the process gas is uniformly supplied into the entire substrate S. Also, the guide member 114b may guide the process gas so that the spread process gas moves in one direction toward the substrate S.

For example, as illustrated in FIG. 4, the guide member 114b may extend in a direction crossing the injection direction of the process gas and be provided in plurality. The plurality of guide members 114 may be disposed to be spaced apart from each other in the direction crossing the injection direction of the process gas within the spreading space. Thus, a gap may be generated between the guide members 114b, and the process gas supplied into the supply hole 114c may be spread through the gap between the guide members 114b and uniformly supplied to the substrate S.

That is, the process gas passing through the supply hole 114c may be supplied to the substrate S without being spread by a pressure difference between a central portion and an outer portion of the body 114a. Thus, the process gas may not be uniformly supplied to the entire surface of substrate S. Thus, the guide member 114b may be installed to reduce the pressure difference between the central portion and the outer portion of the body 114a, thereby spreading the process gas passing through the supply hole 114c.

Alternatively, as illustrated in FIG. 5, the guide member may extend in the injection direction of the process gas and be provided in plurality. The plurality of guide members may be disposed to be spaced apart from each other at the opened portion of the body 114a. Here, the plurality of guide members 114b' may be disposed in a comb-like pattern shape. Thus, an injection path of the process gas, along which the process gas moves in one direction, may be provided between the guide members 114b'. Thus, since the process gas is spread by the guide members 114b', the process gas may be guided to the substrate S while moving along the extending direction of the guide members 114b'.

As described above, the guide member 114b may spread the process gas to induce the flow of the process gas in one direction, i.e., to the substrate S. Thus, the process gas may be supplied in parallel to the top surface of the substrate S to form the laminar flow, and a more amount of process gas may participate in the substrate processing process to improve efficiency of the substrate processing process. However, an exemplary embodiment is not limited to the shape of the guide member 114b. For example, the guide member 114b may have various shapes.

As illustrated in FIG. 7, the body may be integrated with the protrusion part 112 and include a main injection hole 114d defined in a surface of the body, which faces the exhaust hole 115, and an auxiliary injection hole 114e spaced part from the injection hole in a surface of the body, which faces the exhaust hole 115.

Since the body is integrated with the protrusion part 112, the protrusion part 112 may cover the entire top surface of the plate 111. A supply hole for supplying the process gas may be defined in the body. Also, the body may provide a spreading space into which the process gas is supplied to mix the process gas in the spreading space.

The main injection hole 114d may be defined in a surface of the body, which faces the exhaust hole 115. Thus, the process gas supplied into the spreading space of the body may be injected to the substrate S through the main injection hole 114d.

The auxiliary injection hole 114e may be defined in one or plurality in a surface of the body, which faces the exhaust hole 115. The auxiliary injection hole 114e may be spaced apart from the main injection hole 114d at least one portion of both sides of the main injection hole 114d. Thus, when the plurality of laminates 110 are laminated, the auxiliary injection hole 114e may be disposed in a spiral shape with respect to the vertical central axis. The process gas injected from the auxiliary injection hole 114e may adjust a flow of the process injected from the main injection hole 114d so that a more amount of process gas is concentrated to the central portion of the substrate S.

Also, the number of auxiliary injection holes 114e may be variously adjusted in accordance with a height thereof. That is, the number of auxiliary injection holes 114e may gradually decrease downward. Thus, an amount of process gas supplied to the upper processing space disposed at a distance that is far away from the supply line 140 may increase, and an amount of process gas supplied to the lower processing space that is close to the supply line 140 may decrease. The upper processing space in which the process gas supply amount is relatively small and the lower processing space in which the process gas supply amount is relatively large may become uniform in process gas supply amount. However, an exemplary embodiment is not limited to the structure and shape of the body. For example, the body may have various structures and shapes.

The exhaust hole 115 may be defined in the rear side of the plate 111 to correspond to the position of the injection part 114 so that the process gas is exhausted into the tube assembly 110. That is, the exhaust hole 115 and the injection part 114 may be disposed to be spaced apart from each other in the injection direction of the process gas. Also, the exhaust hole 115 may be provided between the hollow part 113 and the second protrusion member 112b of the protrusion part 112 and have a crescent moon shape to correspond to the shape of the plate 111. That is, the injection part 114 and the exhaust hole 115 may be spaced apart from each other in the moving direction of the process gas on the plate 111. Thus, the process gas injected from the front of the plate 111 may move to the rear of the plate 111 and then be introduced into the exhaust hole 115 after reacting with the substrate S.

Also, when the laminates 110 are vertically laminated, the exhaust holes 115 may be vertically disposed in a line to communicate with each other. Thus, the plurality of exhaust holes 115 may provide a path through which the process gas is exhausted. Thus, when the exhaust line 50 is connected to one of the plurality of exhaust holes 115, the suction force may be generated in the whole exhaust holes 115 to exhaust the process gas.

Also, the exhaust holes 115 may have different surface areas for each position. That is, since the exhaust line 50 is connected to the lowermost exhaust hole 115 of the exhaust holes 115, a difference in suction force between the uppermost exhaust hole 115 and the lowermost exhaust hole 115 may occur. Thus, the exhaust hole 115 may have a width that gradually decreases downward. Thus, the upper exhaust hole may control the suction force so that a uniform suction force is generated in the lower exhaust hole. However, an exemplary embodiment is not limited to the shape, surface area, and position of the exhaust hole 115. For example, the exhaust hole 115 may have various shapes, surface areas, and positions.

A plurality of insertion parts 116 may be provided in the protrusion part 112. For example, the insertion part 116 may have a hole shape or a shape that surrounds a portion of the fixing bar 130. Thus, when the plurality of laminates 110 are vertically laminated, the plurality of insertion parts 116 may be vertically disposed in a line to communicate with each other.

The fixing bar 130 may have a bar shape extending in the vertical direction and be provided in plurality. The plurality of fixing bars 130 may be respectively inserted into the plurality of insertion parts 116 to fix the laminates 110. The fixing bar 130 may extend beyond a height of the tube assembly 110 and be fixed to the insertion part 116 provided in the lowermost laminate 110 of the plurality of laminates 110. Thus, the fixing bar 130 may fix and connect the laminates 110 to each other. That is, when the plurality of laminates 110 are fixed by using one fixing bar, the laminates 110 may rotate around the fixing bar 130. Thus, the plurality of fixing bars 130 may be provided so that the hollow parts 113 of the laminates 110 are vertically disposed on the same line to prevent the laminates from rotating. However, an exemplary embodiment is not limited to the shape and the fixed portion of the fixing bar 130. For example, the chamber unit 130 may vary in shape and fixed portion.

The cover 120 covers an upper portion of the uppermost body of the plurality of laminates 110. The cover 120 may have a circular plate shape corresponding to that of the plate 111, and a central portion of the cover 120 may further protrude upward than the outer portion. Thus, a space in which the substrate S is processed may be defined between the cover 120 and the uppermost laminate 110. The cover 120 may cover the upper portion of the laminate 110 to prevent the process gas injected into the space between the cover 120 and the uppermost laminate 110 from leaking to the outside.

Also, a hole corresponding to the insertion part 116 of the laminate 120 may be defined in the cover 120 to connect the cover 120 to the laminate 110 by the fixing bar 130. However, an exemplary embodiment is not limited to the structure and shape of the cover 120. For example, the cover 120 may have various structures and shapes.

As described above, when the plurality of laminates 110 are vertically laminated, as illustrated in FIG. 6, the processing space in which each of the substrates S is processed may be defined between the plurality of laminates 110. Thus, the space in which the process gas injected from the injection part 114 is spread may be reduced, and the process gas may vertically move along the space between the plates 111 and then be guided to the substrate S. Thus, the process gas supplied to a side surface of the substrate S may come into contact with the side surface of the substrate S to move along the top and bottom surfaces of the substrate S. That is, the laminar flow of the process gas may be induced. Since the process gas flows in parallel to the top surface of the substrate S, the process gas may be uniformly supplied to the substrate S to form the thin film having the uniform thickness.

A region may be classified in accordance with the height of the tube assembly 100 in order to reduce the difference between an injection amount of process gas and suction force of the exhaust hole 115, and the distance between the plates 111 and the size of the exhaust hole 115 may be adjusted for each region. Thus, a uniform amount of process gas may be controlled to be supplied into and exhausted from the processing space for each substrate S within the tube assembly 110.

As described above, the plurality of laminates 110 may be laminated to provide a path through which the process gas moves in one direction. Therefore, the space in which the process gas is spread may be reduced to concentratedly supply the process gas to the substrate S. Thus, the amount of process gas supplied to the substrate to actually participate in the substrate processing process may increase to reduce the waste of the process gas and improve the efficiency of the substrate processing process.

Also, the injection part 114 for injecting the process and the exhaust hole 115 through which the process gas is exhausted may be provided in the laminate 110 of the tube assembly 100, and thus, the separate injection nozzle and exhaust duct may not be provided. Therefore, the structure of the equipment may be simplified to easily realize the maintenance and repair.

Also, the laminar flow of the process gas supplied to the substrate S may be induced. Therefore, the process gas may be supplied in parallel to the top surface of the substrate S and thus be uniformly supplied to the entire top surface of the substrate S. Thus, the thin film having the uniform thickness may be formed on the top surface of the substrate S to improve the quality of the thin film.

Hereinafter, a method for assembling the tube assembly in accordance with an exemplary embodiment will be described.

First, the alignment bar (not shown) extending in the vertical direction may be vertically erected. When the alignment bar may be provided in one or more or provided in plurality, the alignment bars may be disposed to be spaced apart from each other along the circumferential shape of the tube assembly 100.

Then, the plurality of laminates 110 are inserted one by one into the alignment bars. That is, when the tube assembly 100 is constituted by the plurality of laminates 110, if the laminates 110 are not aligned with each other, a gap between the laminates 110 may occur. Thus, since the gas within the tube assembly is discharged to the outside, it is important that the plurality of laminates 110 are aligned and assembled at an accurate position. Thus, since the alignment bar may be provided to insert the alignment bar into the laminates 110, the plurality of laminates 110 may be stably assembled.

Here, the alignment bar may be softer than that of the laminate 110. For example, the laminate 110 may be made of quartz, and the alignment bar may be made of Teflon. Thus, since the alignment bar is made of a soft material, while the laminate 110 is inserted, the laminate 110 made of a hard material may be suppressed or prevented from being broken or damaged. Also, the laminate 110 may be suppressed or prevented from being damaged during the assembly.

When all the laminates 110 are inserted into the alignment bar and then completely assembled, one or plurality of fixing bars 130 may be inserted into the insertion parts provided in the laminates 110. The fixing bar 130 may be harder than the alignment bar. For example, the fixing bar 130 may be made of quartz that is the same material as the laminate 110. Thus, even when the substrate is processed in the tube assembly at a high temperature, since the fixing bar 130 and the laminate 110 have the same coefficient of thermal expansion, the fixing bar 130 and the laminate may be prevented from being damaged due to thermal expansion coefficients different from each other.

Then, the alignment bar may be withdrawn and separated from the laminates 110. The substrate processing process is generally performed at a high temperature, and the alignment bar made of a soft material may be vulnerable to heat. Thus, since the alignment bar 110 may be melted or damaged in the state of being inserted, the alignment bar may be separated. That is, after the laminate 110 is assembled to be aligned with the alignment bar, the alignment bar may be fixed by the fixing bar 130, and the alignment bar may be withdrawn.

As described above, while this invention has been particularly shown and described with reference to preferred embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

The invention claimed is:

1. A substrate processing apparatus comprising:
a tube assembly having an inner space in which a plurality of substrates are processed, wherein the tube assembly is assembled by laminating a plurality of laminates, and wherein each of the plurality of laminates comprises an injection part and an exhaust hole;
a substrate holder configured to support the plurality of substrates in a multistage manner in the inner space;
a blocking plate connected to a lower portion of the substrate holder to close an opened lower portion of the tube assembly;
a supply line connected to one injection part of the plurality of laminates to supply a process gas; and
an exhaust line connected to one of a plurality of exhaust holes to exhaust the process gas,
wherein each of the plurality of laminates comprises:
a plate having a surface area,
a hollow part provided in a central portion of the plate and having an inner diameter greater than an outer diameter of the substrate holder so that the substrate holder is movable within the tube assembly,
protrusion parts protruding upward or downward from each of top and bottom surfaces of the plate at a circumference of the plate to contact other laminates and surround the circumference of the plate, and
a plurality of insertion holes provided in the protrusion parts,
wherein the injection part comprises a body having a spreading space into which the process gas is supplied, and the body is separably insertable into at least one of the protrusion parts and sits on the plate,
wherein the tube assembly comprises:
a plurality of fixing bars inserted into the insertion holes, respectively, defined in different areas of the laminates to fix the plurality of laminates, and
a cover connected with an uppermost laminate of the plurality of laminates by the fixing bars to cover an upper portion of the uppermost laminate, wherein each of the fixing bars has a circular bar shape extending in a vertical direction, and the fixing bars are made of the same material as the plurality of laminates, wherein the plurality of substrates are processed in a space surrounded by the plurality of laminates, the cover, and the blocking plate,
wherein the protrusion parts of different laminates are vertically laminated to come into contact with each other, and the plates of different laminates are spaced apart from each other to form a space therebetween.

2. The substrate processing apparatus of claim 1, wherein the injection part is disposed on one side of the plate to inject a flow of process gas from the one side of the plate to an opposite side of the plate, and
the protrusion parts comprise:
a pair of first protrusion members spaced apart from each other on both sides of the plate in a direction crossing an injection direction of the process gas; and
a pair of second protrusion members connected to the pair of first protrusion members and spaced apart from each other in the injection direction of the process gas.

3. The substrate processing apparatus of claim 1, wherein the process gas is injected from one side of the body, which faces the exhaust hole.

4. The substrate processing apparatus of claim 3, wherein at least a portion of the body is opened, and
the injection part further comprises a guide member disposed on the body to adjust a flow of the process gas.

5. The substrate processing apparatus of claim 4, wherein the injection part is disposed on one side of the plate to inject a flow of process gas from the one side of the plate to an opposite side of the plate; and
wherein the guide member is provided in plurality to be spaced apart from each other in a direction crossing an injection direction of the process gas.

6. The substrate processing apparatus of claim 3, wherein a supply hole is defined in each of the plate and the body, and
the supply holes of the plate and the body are aligned in a line to provide a path through which the process gas moves.

7. The substrate processing apparatus of claim 3, wherein the injection part further comprises a main injection hole defined in one side of the body and an auxiliary injection hole defined in one side of the body and spaced apart from the main injection hole.

8. The substrate processing apparatus of claim 1, wherein the inner space of the tube assembly has a diameter equal to the inner diameter of at least one hollow part of each of the plurality of laminates.

9. The substrate processing apparatus of claim 1, wherein the substrate holder is movable within the inner space of the tube assembly, and wherein the substrate holder is movable in a direction orthogonal to the inner diameter of each hollow part of the plurality of laminates.

10. The substrate processing apparatus of claim 1, wherein the inner diameter of the hollow part is orthogonal to the direction the substrate holder is movable within the tube assembly.

11. The substrate processing apparatus of claim 1, wherein the inner diameter of the hollow part of each of the plurality of laminates are aligned.

12. The substrate processing apparatus of claim 1, wherein the plurality of laminates are stacked vertically, with the hollow part of each of the plurality of laminates vertically aligned.

13. The substrate processing apparatus of claim 1, wherein the inner space of the tube assembly has a diameter equal to the inner diameter of the hollow part of each of the plurality of laminates;
wherein the hollow part of each of the plurality of laminates are vertically aligned;
wherein the substrate holder is vertically movable within the tube assembly; and
wherein the substrate holder is vertically movable within the hollow part of each of the plurality of laminates.

14. The substrate processing apparatus of claim 1, wherein the inner space of the tube assembly includes the hollow part of each of the plurality of laminates.

15. The substrate processing apparatus of claim 1, wherein the hollow parts of each of the plurality of laminates vertically align so as to allow vertical movement of the substrate holder between each laminate of the plurality of laminates.

16. A substrate processing apparatus comprising:
a tube assembly comprising a plurality of laminates which form an inner space in which a plurality of substrates are processed;
a substrate holder configured to support the plurality of substrates in the inner space, each substrate supported by a separate stage of the substrate holder;
a blocking plate connected to a lower portion of the substrate holder to close an opened lower portion of the tube assembly;
a supply line to supply a process gas; and
an exhaust line to exhaust the process gas,
wherein each of the plurality of laminates comprises:
a plate having a circular shape with an opening in a central portion of the plate, the opening having a circular shape corresponding to the shape of the substrate holder,
protrusion parts protruding upward or downward from each of top and bottom surfaces of the plate at a circumference of the plate to contact other laminates and surround the circumference of the plate,
an insertion hole provided in each protrusion part,
an injection part connected to the supply line to supply the process gas, and
a plurality of exhaust holes connected to the exhaust line to exhaust the process gas,
wherein the injection part comprises a body having a spreading space into which the process gas is supplied, and the body is separably insertable into the at least one protrusion and sits on the plate, and
wherein the openings of each of the plurality of laminates are aligned to form an outer diameter of the inner space of the tube assembly,
wherein the tube assembly comprises:
at least one fixing bar inserted into the insertion holes of the laminates to fix the plurality of laminates, and
a cover connected with an uppermost laminate of the plurality of laminates by the fixing bars to cover an upper portion of the uppermost laminate,
wherein each of the fixing bars has a circular bar shape extending in a vertical direction, and the fixing bars are made of the same material as the plurality of laminates, and
wherein the plurality of substrates are processed in a space surrounded by the plurality of laminates, the cover, and the blocking plate,
wherein the protrusion parts of different laminates are vertically laminated to come into contact with each other, and the plates of different laminates are spaced apart from each other to form a space therebetween.

* * * * *